(12) United States Patent
Ali et al.

(10) Patent No.: US 8,116,420 B2
(45) Date of Patent: Feb. 14, 2012

(54) CLOCK-FORWARDING TECHNIQUE FOR HIGH-SPEED LINKS

(75) Inventors: Tamer M. Ali, Los Angeles, CA (US);
Robert J. Drost, Los Altos, CA (US);
Chih-Kong Ken Yang, Pacific Palisades, CA (US)

(73) Assignee: Oracle America, Inc., Redwood Shores, CA (US)

( * ) Notice: Subject to any disclaimer, the term of this patent is extended or adjusted under 35 U.S.C. 154(b) by 235 days.

(21) Appl. No.: 12/642,348

(22) Filed: Dec. 18, 2009

(65) Prior Publication Data

US 2011/0150159 A1    Jun. 23, 2011

(51) Int. Cl.
*H03D 3/24* (2006.01)
(52) U.S. Cl. ........ 375/373; 375/371; 375/211; 375/214; 375/215; 375/376; 370/503; 370/279; 370/293; 370/315
(58) Field of Classification Search .................. 375/373, 375/371, 375, 376, 356, 211, 214, 215; 370/503, 370/279, 293, 315
See application file for complete search history.

(56) References Cited

U.S. PATENT DOCUMENTS

| | | | | |
|---|---|---|---|---|
| 7,139,308 | B2 * | 11/2006 | Doblar et al. | 375/215 |
| 7,280,589 | B2 * | 10/2007 | Smith et al. | 375/215 |
| 7,313,210 | B2 * | 12/2007 | Radjassamy | 375/354 |
| 2002/0075981 | A1 * | 6/2002 | Tang et al. | 375/372 |
| 2006/0133466 | A1 * | 6/2006 | Palmer et al. | 375/215 |

* cited by examiner

*Primary Examiner* — Phuong Phu
(74) *Attorney, Agent, or Firm* — Park, Vaughan, Fleming & Dowler LLP; Steven E. Stupp

(57) ABSTRACT

A repeater circuit, such as a clock regeneration and multiplication circuit, is described. In this repeater circuit, a clock multiplier unit (CMU) generates an internal clock signal based on a forwarded clock signal, which is received on a link. Furthermore, a phase interpolator (PI) in the repeater circuit provides the output clock signal based on the forwarded clock signal and the internal clock signal. Note that the CMU and the PI filter reduce the cycle-to-cycle jitter in the forwarded clock signal and the internal clock signal, and that the output clock signal has a phase that is a weighted average of the phases of the forwarded clock signal and the internal clock signal. In addition, the relative weights of the forwarded clock signal and the internal clock signal (i.e., the amount of phase averaging and jitter filtering) may be adjusted based on a position or location on the link.

20 Claims, 5 Drawing Sheets

CLOCK-FORWARDING TECHNIQUE FOR HIGH-SPEED LINKS

BACKGROUND

1. Field

The present disclosure generally relates to repeater circuits. More specifically, the present disclosure relates to a repeater circuit that includes a phase interpolator, which is suitable for use in high-speed links.

2. Related Art

Clock forwarding is used in a wide variety of systems. As illustrated in FIG. 1, which presents a block diagram illustrating a system 100, during clock forwarding a data signal 108 and a clock signal 110 are typically output onto corresponding data signal line 116-1 and clock signal line 116-2 within a link 114 by a transmit circuit 112. Typically, data signal 108 has a higher fundamental frequency than clock signal 110.

At one or more locations 118 along link 114, repeater circuits 120 compensate for attenuation by amplifying data signal 108 and clock signal 110. For example, an internal clock signal, which has the same fundamental frequency as data signal 108, may be generated in repeater circuit 120-1 based on clock signal 110 using clock circuit 122. This internal clock signal may be used to synchronize amplification and recovery of data signal 108 by data-recovery circuit 124 because the low-frequency transmit jitter (such as flicker noise) in the internal clock signal is the same as the low-frequency transmit jitter in (forwarded) clock signal 110 and data signal 108. Note that by using such an internal clock signal, the tracking requirements for data-recovery circuit 124 may be reduced. In many cases, data recovery may be implemented with a static phase adjustment of the generated internal clock signal relative to data signal 108.

After amplification using a sense amplifier (SA) 126 and a clock amplifier 128, and data recovery using data-recovery circuit 124, the amplified data signal and an amplified clock signal are output onto link 114 by drivers 130 in repeater circuit 120-1. These signals may be subsequently received by a receive circuit 132 at the end of link 114 or by one or more optional additional repeater circuits 120 along link 114.

However, this type of repetitive clock forwarding can eventually contaminate the forwarded clock signal because of noise introduced by the clock amplifier(s) (such as clock amplifier 128) in repeater circuit(s) 120. Because of a time-slope conversion, this noise typically manifests itself as cycle-to-cycle jitter in the time domain.

Note that the cycle-to-cycle jitter can limit the number of repeater circuits 120 that can be used along link 114, and thus limits a total length 134 of link 114 at a given frequency. For example, the length of links based on copper cables (or cables that include another metal), such as in systems that communicate electrical signals which are compatible with an Ethernet communications protocol and/or an Infiniband communications protocol, is often restricted to less than 10 m. To address this difficulty, optical cables or fibers can be used. However, this increases the cost and complexity of these systems.

Hence, what is needed is a repeater circuit and an associated system that does not suffer from the above-described problems.

SUMMARY

One embodiment of the present disclosure provides a repeater circuit that includes a first input node that receives a forwarded clock signal, and a clock multiplier unit (CMU), coupled to the first input node, that generates an internal clock signal based at least on the forwarded clock signal. Furthermore, a phase interpolator (PI) in the repeater circuit, which is coupled to the first input node and the CMU, provides an output clock signal based on the forwarded clock signal and the internal clock signal. Note that the CMU and the PI filter cycle-to-cycle jitter in the forwarded clock signal and the internal clock signal, and that the output clock signal has a phase that is a weighted average of the phases of the forwarded clock signal and the internal clock signal. Additionally, a first output node in the repeater circuit, which is coupled to the PI, provides the output clock signal.

In some embodiments, the repeater circuit includes: a second input node that receives a data signal; a sense amplifier, coupled to the second input node, which provides a processed data signal based on the data signal and a second internal clock signal, which corresponds to the internal clock signal; and a second output node, coupled to the sense amplifier, which provides the processed data signal. For example, the internal clock signal may be a divide-by-M version of the second internal clock signal, where M is an integer.

Moreover, the CMU may include a multiplying delay locked loop (MDLL) and/or a multiplying phase locked loop (MPLL).

Furthermore, the first input node may be coupled to a first signal line, and the first output node may be coupled to a second signal line. For example, the first signal line and the second signal line, separately or in combination, may have a length of at least 100 m. These signal lines may each be configured to convey electrical signals, such as electrical signals that are compatible with an Ethernet communications protocol and/or an Infiniband communications protocol. In some embodiments, the first signal line and the second signal line each include a copper link (or a link that includes cables with another metal).

Note that relative weights of the phases of the forwarded clock signal and the internal clock signal in the weighted average may be selected based on a location, with respect to a source, of the forwarded clock signal on the first signal line. For example, a relative weight of a phase of the forwarded clock signal may be larger for locations proximate to the source, and a relative weight of a phase of the internal clock signal may be larger distal from the source.

In some embodiments, the CMU and the PI comprise a phase-domain filter, such as a low-pass filter.

Another embodiment provides a system that includes the first signal line, the repeater circuit and the second signal line.

Another embodiment provides the output clock signal using the repeater circuit. During this method, the forwarded clock signal is received from the first signal line at the first input node of the repeater circuit. Then, the internal clock signal is generated based at least on the forwarded clock signal using the CMU in the repeater circuit. Moreover, the output clock signal is provided based on the forwarded clock signal and the internal clock signal using the PI in the repeater circuit. Next, the output clock signal is provided to the second signal line from the first output node of the repeater circuit.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

The following description is presented to enable any person skilled in the art to make and use the disclosure, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

Embodiments of a repeater circuit (such as a clock regeneration and multiplication circuit), a system that includes the repeater circuit, and a method for providing an output clock signal using the repeater circuit are described. In the repeater circuit, a clock multiplier unit (CMU) generates an internal clock signal based at least on a forwarded clock signal, which is received on a link. Furthermore, a phase interpolator (PI) in the repeater circuit provides the output clock signal based on the forwarded clock signal and the internal clock signal. Note that the CMU and the PI filter reduce the cycle-to-cycle jitter in the forwarded clock signal and the internal clock signal, and that the output clock signal has a phase that is a weighted average of the phases of the forwarded clock signal and the internal clock signal. In addition, the relative weights of the forwarded clock signal and the internal clock signal (i.e., the amount of phase averaging and jitter filtering) may be adjusted based on a position or location on the link.

This repeater circuit facilitates the use of longer copper or metal cable links in source-synchronous systems, such as those that communicate electrical signals which are compatible with an Ethernet communications protocol (for example, 100 Gb Ethernet) and/or an Infiniband communications protocol. For example, copper cables having lengths approximately greater than or equal to 100 m may be used (as opposed to using optical cables) and/or higher data rates can be communicated. Consequently, the cost of these systems may be reduced and/or the performance may be improved.

Figure 1:
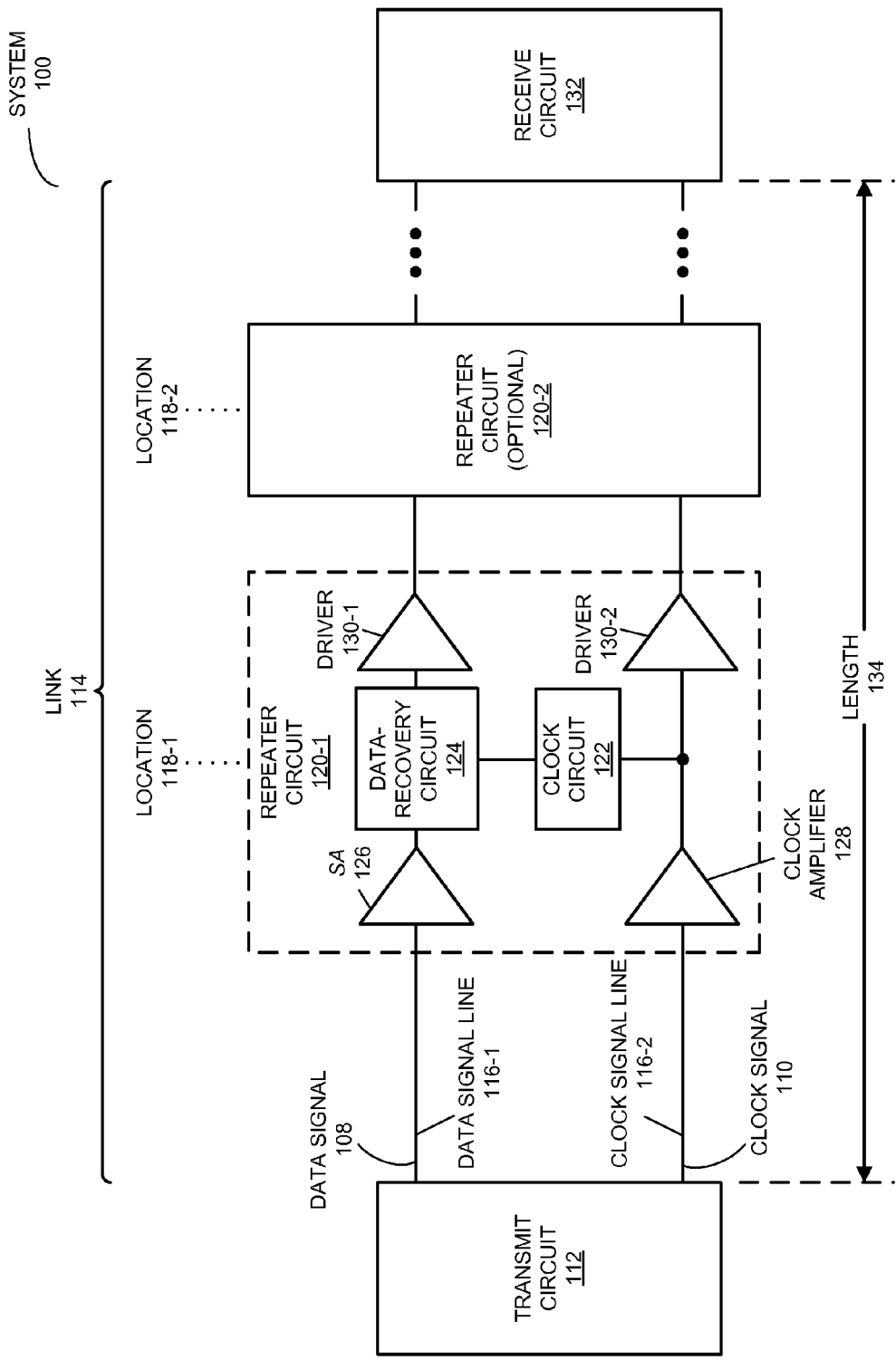
FIG. 1 is a block diagram illustrating an existing system that includes clock forwarding.
Figure 2:
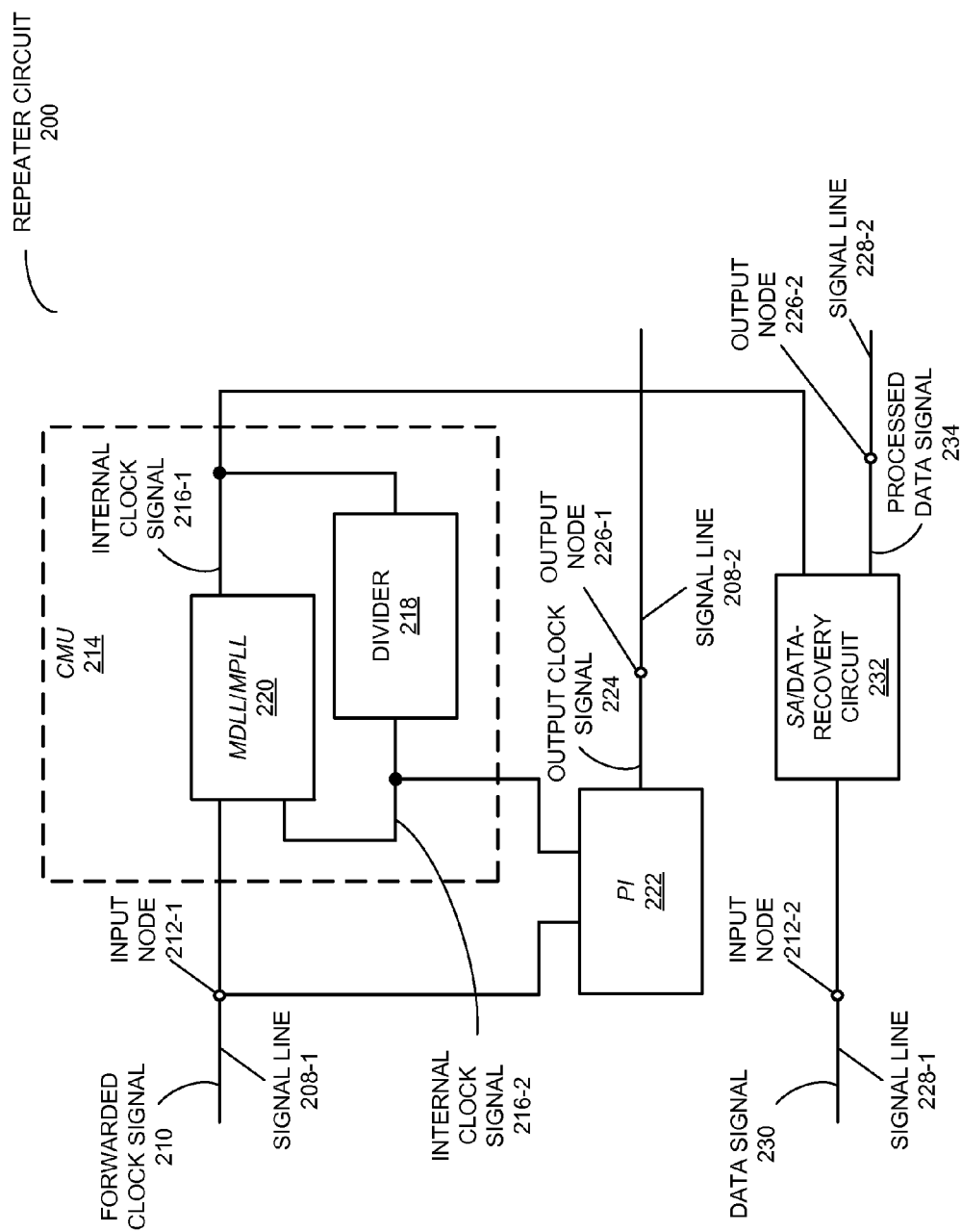
FIG. 2 is a block diagram illustrating a repeater circuit in accordance with an embodiment of the present disclosure.

We now describe embodiments of the repeater circuit, which may be used in system 100 (FIG. 1). FIG. 2 presents a block diagram illustrating a repeater circuit 200. This repeater circuit includes an input node 212-1 that receives a forwarded clock signal 210 (having a fundamental frequency fin) on signal line 208-1 in a link, and a clock multiplier unit (CMU) 214, coupled to input node 212-1, that generates an internal clock signal 216-1 (having a fundamental frequency fout that is a multiple of fin) based at least on forwarded clock signal 210 and internal clock signal 216-2. In particular, CMU 214 may generate internal clock signal 216-1 by selectively synchronously injecting edges in forwarded clock signal 210 and internal clock signal 216-2 into internal clock signal 216-1.

Note that divider 218 may divide internal clock signal 216-1 by M (where M may be an integer) to provide internal clock signal 216-2.

Furthermore, a phase mixer or interpolator (PI) 222, which is coupled to input node 212-1 and CMU 214, provides an output clock signal 224 based on forwarded clock signal 210 and internal clock signal 216-2. Additionally, an output node 226-1, which is coupled to PI 222, provides output clock signal 224 on signal line 208-2 to subsequent components (such as additional instances of repeater circuit 200) on the link (i.e., output clock signal 224 becomes the forwarded clock signal for the next repeater circuit on the link).

Repeater circuit 200 may also include: an input node 212-2 that receives a data signal 230 (i.e., data) on signal line 228-1 in the link; a sense amplifier/data-recovery circuit 232, coupled to input node 212-2, which provides a processed data signal 234 based on data signal 230 and internal clock signal 216-1; and an output node 226-2, coupled to sense amplifier/data-recovery circuit 232, which provides processed data signal 234 on signal line 228-2 in the link.

Note that the period of forwarded clock signal 210 is a multiple of the data bit time in data signal 230, and that in order to retime the received data, CMU 214 may include a multiplying delay locked loop (MDLL) and/or a multiplying phase locked loop (MPLL) 220. Moreover, note that the delay between internal clock signal 216-1 and forwarded clock signal 210 is at least one reference clock period. By mixing the phase of internal clock signal 216-2 with the phase of forwarded clock signal 210, jitter filtering may occur at the output of PI 222. Stated differently, output clock signal 224 may have a phase that is a weighted average of the phases of forwarded clock signal 210 and internal clock signal 216-2, and CMU 214 and PI 222 may filter cycle-to-cycle jitter in forwarded clock signal 210 and internal clock signal 216-2. Note that, in general, the jitter may include deterministic jitter (such as that associated with a periodic interference signal and/or data-dependent jitter, which is also referred to as intersymbol interference) and non-deterministic jitter (such as random noise).

In particular, if the delay between forwarded clock signal 210 and internal clock signal 216-2 is one clock cycle corresponding to fin, and setting the interpolation weights in PI 222 to 0.5, the transfer function of the jitter filtering can be represented by $$H(z) = \frac{1}{2} \cdot (1 + z^{-1}).$$

(As discussed further below, the weights of the phases of forwarded clock signal 210 and internal clock signal 216-2 may be adjusted based on the location of repeater circuit 200 on the link.) This is the transfer function of a first-order phase-domain finite-impulse-response filter. (Thus, CMU 214 and PI 222 may comprise a first-order phase-domain filter, such as a low-pass filter.) This transfer function nulls out any jitter at a frequency equal to one half of fin.

In some embodiments, signal line 208-1 and signal line 208-2, either separately or in combination, may have a length of at least 100 m. Similarly, signal line 228-1 and signal line 228-2, separately or in combination, may have a length of at least 100 m. These signal lines may each be configured to convey electrical signals, such as electrical signals that are compatible with an Ethernet communications protocol and/or an Infiniband communications protocol. In some embodiments, signal lines 208 and/or 228 each include a copper link (or a link that includes cables with another metal, such as aluminum, gold or silver.

Figure 3:
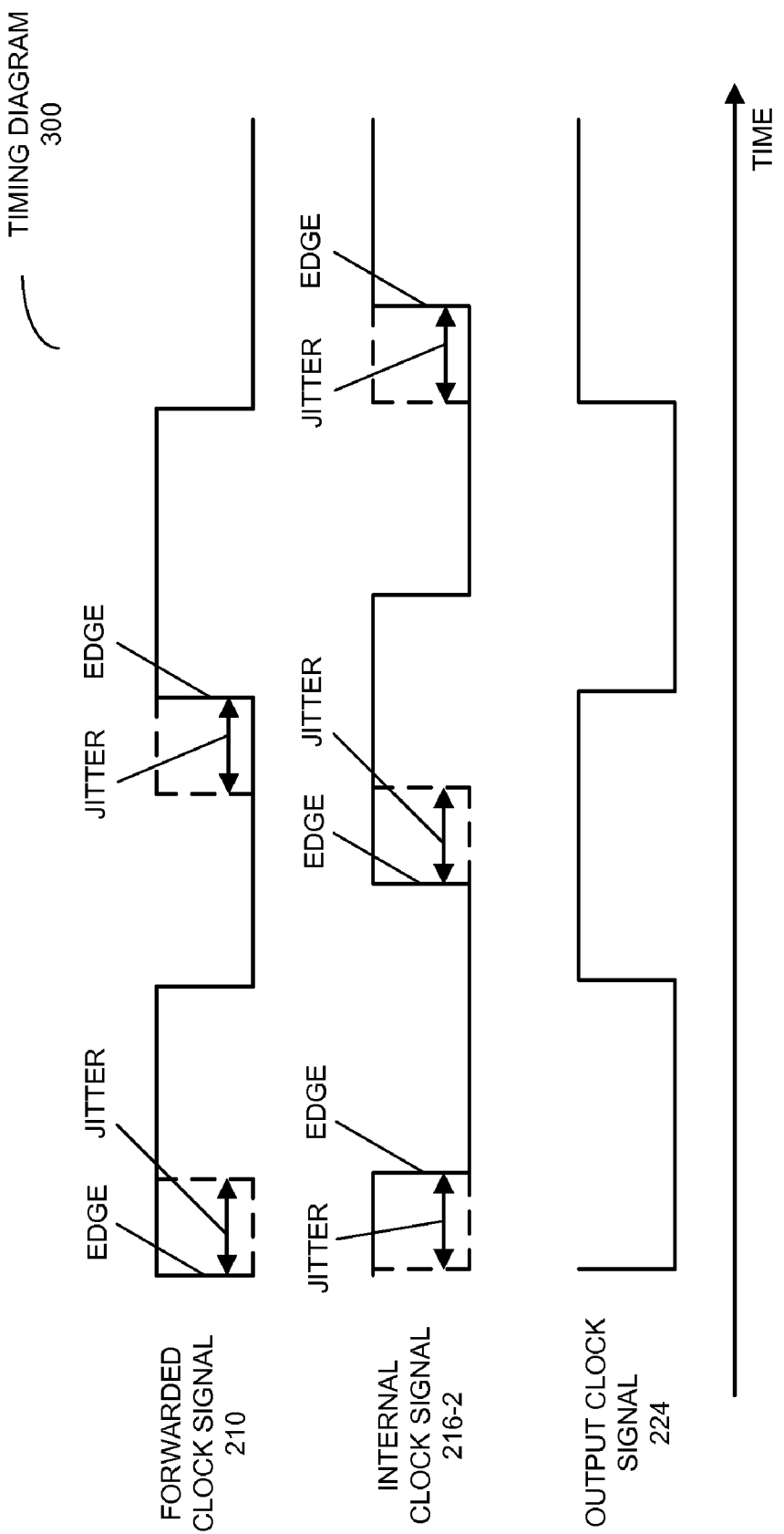
FIG. 3 is a timing diagram illustrating jitter filtering of a forwarded clock signal in accordance with an embodiment of the present disclosure.

FIG. 3 presents a timing diagram 300 illustrating jitter filtering of forwarded clock signal 210. In particular, while high-frequency jitter alters the edge positions in forwarded clock signal 210 and internal clock signal 216-2, the interpolation filters out this jitter in output clock signal 224.

Referring back to FIG. 2, note that noise in the oscillator (or the delay-line) used in MPLL/MDLL 220 can also lead to jitter. Consequently, the relative weights of the phases of forwarded clock signal 210 and internal clock signal 216-2 in the weighted average may be selected based on a location (such as location 118-1 in FIG. 1), with respect to a source, of forwarded clock signal 210 on signal line 208-1. For example, a relative weight of a phase of forwarded clock signal 210 may be larger for locations proximate to the source (such as at the first few repeater circuits on the link) where forwarded clock signal 210 is cleaner than internal clock signal 216-2, and a relative weight of a phase of internal clock signal 216-2 may be larger distal from the source (such as near the end of the link) where forwarded clock signal 210 is contaminated with amplifier noise. By further reducing the jitter in the forwarded clock signal on the link, the total length of the link can be extended.

Figure 4:
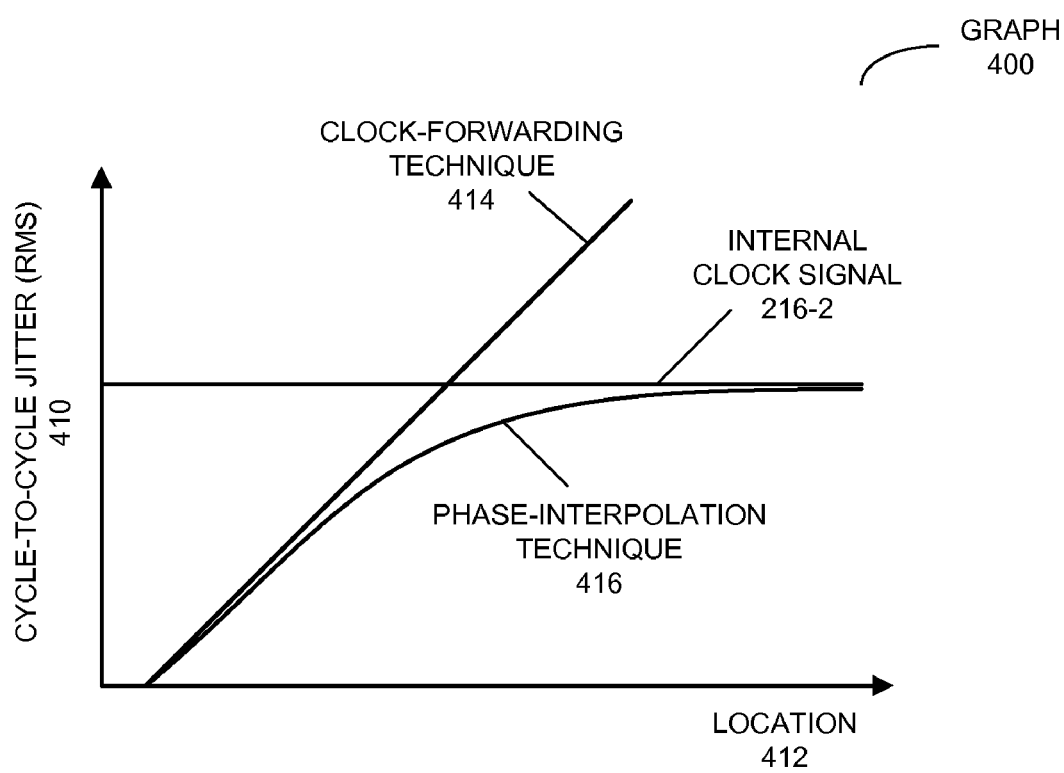
FIG. 4 is a graph illustrating cycle-to-cycle jitter as a function of location along a link in accordance with an embodiment of the present disclosure.

We now present simulation results. FIG. 4 presents a graph 400 illustrating cycle-to-cycle jitter 410 as a function of the location 412 along a link. In a traditional clock-forwarding technique 414, the cycle-to-cycle jitter increases exponentially as location 412 increases (i.e., as the forwarded clock signal is sequentially amplified in a series of repeater circuits). This is because the noise from earlier instances of the repeater circuits on the link is amplified in all of the subsequent instances of the repeater circuit.

Using phase-interpolation technique 416 in repeater circuit 200 (FIG. 2), the cycle-to-cycle jitter tends to follow the jitter in internal clock signal 216-2 at locations along the link that are distal from the source. Thus, phase-interpolation technique 416 reduces the cycle-to-cycle jitter in the forwarded clock signal at the cost of introducing longer time-scale jitter, which is associated with internal clock signal 216-2. However, a timing-recovery circuit in a receiver circuit at the end of the link can be used to track this longer time-scale jitter.

In an exemplary embodiment, forwarded clock signal 210 (FIG. 2), internal clock signal 216-2 (FIG. 2) and output clock signal 224 (FIG. 2) each may have a fundamental frequency of 500 MHz, and internal clock signal 216-1 (FIG. 2) may have a fundamental frequency of 5 GHz (and, thus, data signal 230 in FIG. 2 may have a bit time corresponding to a data rate of 10 Gbps).

In some embodiments, PI 222 (FIG. 2) is implemented using a weighting circuit that mixes phases of internal signals based on impedance values in two arms of a voltage divider. For example, the impedances may be capacitors, the impedance values may be associated capacitances, and the phases may be summed at a central node between the two arms according to the weighted sum of the capacitances. Furthermore, a biasing circuit, which is coupled to the central node, may amplify the interpolated signal to the desired swing on an output node of PI 222 (FIG. 2), and may set the DC common mode for the central node (i.e., it may provide DC bias). Note that the capacitors may be passive, linear components. In addition, the capacitance values may be selectable, for example, using a switched capacitance network with pass gates coupled to capacitors in banks of parallel capacitors (such as metal capacitors that each have a capacitance of a few fempto Farads). At a given time, control signals may select a desired capacitance value by opening and/or closing pass gates so that only one of internal signals is coupled to a given capacitor.

Repeater circuit 200 (FIG. 2) may be used in a variety of applications, including: VLSI circuits, communication systems, storage area networks, data centers, networks (such as local area networks), and/or computer systems (such as multiple-core processor computer systems). For example, embodiments of the repeater circuit may be used in a high-speed serial link in a processor, a memory controller (including buffer-onboard application-specific integrated circuits), and/or a switch chip. Furthermore, the computer systems may include, but are not limited to: a server (such as a multi-socket, multi-rack server), a laptop computer, a communication device or system, a personal computer, a work station, a mainframe computer, a blade, an enterprise computer, a data center, a portable-computing device, a supercomputer, a network-attached-storage (NAS) system, a storage-area-network (SAN) system, and/or another electronic computing device. Note that a given computer system may be at one location or may be distributed over multiple, geographically dispersed locations.

Repeater circuit 200 (FIG. 2), as well as systems (such as system 100 in FIG. 1) that may include repeater circuit 200 (FIG. 2), may include fewer components or additional components. Although repeater circuit 200 (FIG. 2), as well as system 100 (FIG. 1), are illustrated as having a number of discrete items, these circuits and devices are intended to be functional descriptions of the various features that may be present rather than structural schematics of the embodiments described herein. Consequently, in these embodiments two or more components may be combined into a single component, and/or a position of one or more components may be changed. Furthermore, note that circuits in these embodiments may be implemented using PMOS and/or NMOS, and signals may include digital signals that have approximately discrete values and/or analog signals that have continuous values.

Figure 5:
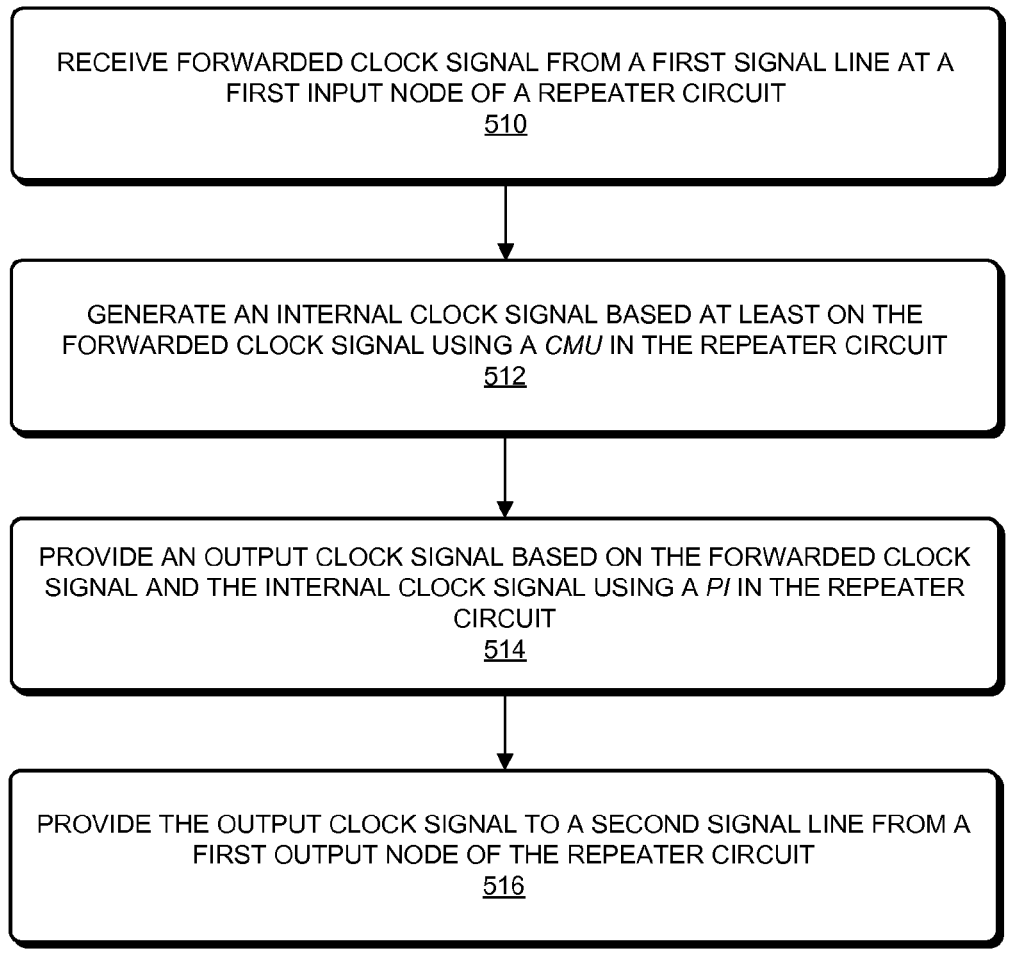
FIG. 5 is a flow chart illustrating a process for providing an output clock signal in accordance with an embodiment of the present disclosure.

We now describe embodiments of a process. FIG. 5 presents a flow chart illustrating a process 500 for providing an output clock signal using a repeater circuit, such as repeater circuit 200 (FIG. 2). During this method, the forwarded clock signal is received from the first signal line at the first input node of the repeater circuit (operation 510). Then, the internal clock signal is generated based at least on the forwarded clock signal using the CMU in the repeater circuit (operation 512). Moreover, the output clock signal is provided based on the forwarded clock signal and the internal clock signal using the PI in the repeater circuit (operation 514). Next, the output clock signal is provided to the second signal line from the first output node of the repeater circuit (operation 516).

In some embodiments of process 500, there are additional or fewer operations. Moreover, the order of the operations may be changed, and/or two or more operations may be combined into a single operation.

The foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art. Additionally, the above disclosure is not intended to limit the present disclosure. The scope of the present disclosure is defined by the appended claims.

What is claimed is:
1. A repeater circuit, comprising:
a first input node configured to receive a forwarded clock signal;

a clock multiplier unit (CMU), coupled to the first input node, configured to generate an internal clock signal based at least on the forwarded clock signal;

a phase interpolator (PI), coupled to the first input node and the CMU, configured to provide an output clock signal based on the forwarded clock signal and the internal clock signal, wherein the CMU and the PI filter cycle-to-cycle jitter in the forwarded clock signal and the internal clock signal, and wherein the output clock signal has a phase that is a weighted average of the phases of the forwarded clock signal and the internal clock signal; and a first output node, coupled to the PI, configured to provide the output clock signal.

2. The repeater circuit of claim 1, further comprising:

a second input node configured to receive a data signal;

a sense amplifier, coupled to the second input node, configured to provide a processed data signal based on the data signal and a second internal clock signal that corresponds to the internal clock signal; and a second output node, coupled to the sense amplifier, configured to provide the processed data signal.

3. The repeater circuit of claim 2, wherein the internal clock signal is a divide-by-M version of the second internal clock signal; and wherein M is an integer.

4. The repeater circuit of claim 1, wherein the CMU includes a multiplying delay locked loop (MDLL) or a multiplying phase locked loop (MPLL).

5. The repeater circuit of claim 1, wherein the first input node is configured to couple to a first signal line; and wherein the first output node is configured to couple to a second signal line.

6. The repeater circuit of claim 5, wherein the first signal line and the second signal line, separately or in combination, have a length of at least 100 m.

7. The repeater circuit of claim 5, wherein the first signal line and the second signal line each are configured to convey electrical signals.

8. The repeater circuit of claim 7, wherein the electrical signals are compatible with an Ethernet communications protocol.

9. The repeater circuit of claim 7, wherein the electrical signals are compatible with an Infiniband communications protocol.

10. The repeater circuit of claim 5, wherein the first signal line and the second signal line each comprise a copper link.

11. The repeater circuit of claim 5, wherein relative weights of the phases of the forwarded clock signal and the internal clock signal in the weighted average are selected based on a location, with respect to a source, of the forwarded clock signal on the first signal line.

12. The repeater circuit of claim 11, wherein a relative weight of a phase of the forwarded clock signal is larger for locations proximate to the source, and a relative weight of a phase of the internal clock signal is larger distal from the source.

13. The repeater circuit of claim 1, wherein the CMU and the PI comprise a phase-domain filter.

14. The repeater circuit of claim 13, wherein the phase-domain filter includes a low-pass filter.

15. A system, comprising a link that includes a first signal line, a repeater circuit, and a second signal line, wherein the repeater circuit includes:

a first input node, coupled to the first signal line, configured to receive a forwarded clock signal;

a clock multiplier unit (CMU), coupled to the first input node, configured to generate an internal clock signal based at least on the forwarded clock signal;

a phase interpolator (PI), coupled to the first input node and the CMU, configured to provide an output clock signal based on the forwarded clock signal and the internal clock signal, wherein the CMU and the PI filter cycle-to-cycle jitter in the forwarded clock signal and the internal clock signal; and wherein the output clock signal has a phase that is a weighted average of the phases of the forwarded clock signal and the internal clock signal; and a first output node, coupled to the PI and the second signal line, configured to provide the output clock signal.

16. The system of claim 15, wherein the CMU includes a multiplying delay locked loop (MDLL) or a multiplying phase locked loop (MPLL).

17. The system of claim 15, wherein relative weights of the phases of the forwarded clock signal and the internal clock signal in the weighted average are selected based on a location, with respect to a source, of the forwarded clock signal on the first signal line.

18. The system of claim 17, wherein a relative weight of a phase of the forwarded clock signal is larger for locations proximate to the source, and a relative weight of a phase of the internal clock signal is larger distal from the source.

19. The system of claim 15, wherein the CMU and the PI comprise a phase-domain filter.

20. A method for providing an output clock signal using a repeater circuit, comprising:

receiving a forwarded clock signal from a first signal line at a first input node of the repeater circuit;

generating an internal clock signal based at least on the forwarded clock signal using a CMU in the repeater circuit;

providing an output clock signal based on the forwarded clock signal and the internal clock signal using a PI in the repeater circuit, wherein the CMU and the PI filter cycle-to-cycle jitter in the forwarded clock signal and the internal clock signal, and wherein the output clock signal has a phase that is a weighted average of the phases of the forwarded clock signal and the internal clock signal; and providing the output clock signal to a second signal line from a first output node of the repeater circuit.

* * * * *